(12) United States Patent
Gupta

(10) Patent No.: US 6,947,883 B1
(45) Date of Patent: Sep. 20, 2005

(54) METHOD FOR DESIGNING MIXED SIGNAL INTEGRATED CIRCUITS AND CONFIGURABLE SYNCHRONOUS DIGITAL NOISE EMULATOR CIRCUIT

(76) Inventor: Vikram Gupta, 139 Griglio Dr., San Jose, CA (US) 95134-1536

( * ) Notice: Subject to any disclaimer, the term of this patent is extended or adjusted under 35 U.S.C. 154(b) by 614 days.

(21) Appl. No.: 09/618,971

(22) Filed: Jul. 19, 2000

(51) Int. Cl.$^7$ ............................................. G06F 9/455
(52) U.S. Cl. ........................................ 703/23; 716/17
(58) Field of Search .............................. 703/14, 15, 28, 703/23; 716/4, 17; 700/56, 14, 15; 702/117; 714/724, 227; 324/765; 331/78; 708/319; 709/200

(56) References Cited

U.S. PATENT DOCUMENTS

| | | | | |
|---|---|---|---|---|
| 4,831,510 A | * | 5/1989 | Dummermuth et al. | ....... 700/56 |
| 5,193,070 A | * | 3/1993 | Abiko et al. | ................. 708/319 |
| 5,563,524 A | * | 10/1996 | Ungar | ......................... 324/765 |
| 5,668,507 A | * | 9/1997 | Boersler et al. | ............... 331/78 |
| 5,754,764 A | * | 5/1998 | Davis et al. | ................. 709/200 |
| 5,793,778 A | * | 8/1998 | Qureshi | ...................... 714/727 |
| 6,282,503 B1 | * | 8/2001 | Okazaki et al. | ............... 703/15 |
| RE37,500 E | * | 1/2002 | Lee | ............................. 324/765 |
| 6,460,172 B1 | * | 10/2002 | Insenser farre et al. | ....... 716/17 |
| 6,625,557 B1 | * | 9/2003 | Perkins et al. | ............... 702/117 |
| 2001/0049806 A1 | * | 12/2001 | Porteners et al. | ........... 714/724 |

* cited by examiner

Primary Examiner—Kevin J. Teska
Assistant Examiner—Kandasamy Thangavelu
(74) Attorney, Agent, or Firm—Sterne, Kessler, Goldstein & Fox PLLC

(57) ABSTRACT

A method for designing an integrated circuit having analog and digital circuit portions is disclosed. The method involves providing an emulation circuit, which preferably comprises a number of gates equivalent to a number of gates in the digital circuit portion, affixing the emulation circuit on a test substrate together with a version of the analog circuit portion having at least some of the defined functions of the analog circuit portion, and then testing the analog circuit version.

32 Claims, 10 Drawing Sheets

Configuration Register Write

Configuration Register Read

METHOD FOR DESIGNING MIXED SIGNAL INTEGRATED CIRCUITS AND CONFIGURABLE SYNCHRONOUS DIGITAL NOISE EMULATOR CIRCUIT

BACKGROUND OF THE INVENTION

The present invention is related to the use of a digital emulator circuit to speed the design of mixed digital/analog signal integrated circuits and in particular, the design of such integrated circuits with RF (Radio Frequency) signal components.

Many of the advances in the present revolution in telecommunications have come in the field of wireless communications. In wireless communication systems, the broadcast signals are RF, and in many of such communication systems the signals are processed in digital form. Until now, the components handling these disparate types of signals were separate analog and digital devices. However, with the demand for handheld devices, such as telephones, pagers and personal digital assistants (PDAs), many of these analog and digital circuit components are being integrated on a single chip to achieve low power, lower costs, and miniaturization.

However, there are problems with the association of digital and analog circuits on a single integrated circuit. For example, the high-speed switching in the digital circuit portion of the integrated circuit creates noise that can adversely affect the circuits in the analog portion of the integrated circuit. There are radiative and both capacitive as well as conductive coupling components of noise generated by the digital circuits that interfere with sensitive circuits in the analog circuit portion.

Because of these noise sources, proper and timely evaluation of the analog portion during product development requires that the digital portion function correctly and be ready for integration at the same time as the analog portion. Unfortunately, with existing design methodologies, this is not often possible. The design of the digital portion may be delayed, therefore postponing analog evaluation. This may occur in part because different designers, design groups, or even companies are working on each portion. Also, early versions of the digital portion may not work properly, and therefore will not generate the same noise as later corrected versions. This complicates the analog designer's task since as the noise profile of the digital portion changes, so does the analog portion's response.

Furthermore, there are usually several ways to design the architecture of a digital portion. Each of these will have a different noise profile, so the analog circuits will respond differently. While a particular architecture's noise may have a comparatively benign profile, this is very difficult to discover since it would involve the design and manufacture of a new chip for each architecture that a designer wants to try.

SUMMARY OF THE INVENTION

It is an object of the present invention to provide a design methodology that substantially avoids these problems so that such integrated circuits can be designed expeditiously. This new methodology involves the use of a digital emulator circuit that can be added to an analog portion of a chip to form a test structure. This test structure can then be used to evaluate the analog portion. There is no need to wait for the completion of the digital portion; the digital and analog portions of the design may proceed independently. Also, revised analog portions are compared to previous versions without changes in the digital portion. This helps keep the analog designers from having to hit a "moving target".

Furthermore, the emulator may be electronically modified "on the fly" such that different architectures may be tried. Clock frequency, the complexity of the logic between flip-flops, the amount of logic, and the like may be altered. In this way, it is possible to find the architecture that is most benign to the analog portion, and the digital portion may be designed accordingly.

It is important to note that the terms, "digital portion" and "analog portion", are used as convenient labels rather than descriptive or limiting terms. "Digital portion" means a portion of circuitry that generates some type of noise capable of degrading the performance of another portion of circuitry. A "digital portion" may be traditional logic structures including, but not limited to, logic gates, flip-flops, registers, memory cells. It may also comprise a microprocessor. Particularly in RF circuits, it may comprise baseband, digital signal processing (DSP), modem circuits, or the like. Alternately or in combination, the "digital portion" may be analog or RF circuits that generate noise that may be of concern.

An "analog portion" may comprise RF circuits including, but not limited to, Low Noise Amplifiers (LNAs), mixers, limiters, filters, Voltage Controlled Oscillators (VCOs), and discriminators. Alternately, this portion may comprise traditional analog, such as voltage regulators, references, and amplifiers, among others. Also, the analog portion may actually comprise logic cells; say, for example, where it is desirable that two paths of logic match each other closely in delay time. Moreover, the analog portion may comprise components, such as resistors, inductors, capacitors, bipolar and CMOS transistors and the like.

One embodiment of the present invention provides a method of designing an integrated circuit having digital and analog circuit portions, each having a defined functionality. The method includes providing an emulation circuit which is capable of generating noise; affixing the emulation circuit on a test substrate; providing a version of the analog circuit portion having at least some of defined functions of the analog circuit portion; affixing the analog circuit version on the test substrate; and testing the analog circuit version.

One embodiment of the present invention provides for a digital noise emulation circuit in a test substrate for an integrated circuit having a separate analog circuit portion. The circuit for the digital noise emulation circuit has a control block, a plurality of shift arrays made up of flip-flops and interconnecting logic, and a plurality of input/output pads. Interface commands are provided to the digital emulation circuit at the input/output pads. The control block decodes these commands and directs each of the arrays to perform operations, each of which produces a different noise characteristic. Based on the input pattern that is fed to the digital emulation circuit, the input/output pads, which are normally the largest source of noise, can be characterized for their noise effects. The input clock rate can be varied over a wide range according to the process for which the digital circuit is timed so that each array or a combination of arrays can be exercised over a wide range of frequencies.

DESCRIPTION OF THE SPECIFIC EMBODIMENTS

In one present design methodology for integrating digital and analog signal circuits, the two types of circuits are developed in parallel. The analog circuits are placed on test substrates, where they often undergo many iterations. The digital circuit portion of the integrated circuit is obtained separately by simulating the desired functions of the digital signal circuit or by implementing the digital signal circuit in a prototype. FPGAs (Field Programmable Gate Arrays) are often used in such digital circuit prototyping. These simulations or prototypes are also often revised many times. Eventually, the final versions of the analog circuit portion and digital signal portion are merged in a single integrated circuit, which is hopefully the final product.

Unfortunately, analog circuits are typically sensitive to noise from the digital portions. Therefore, analog circuits often do not behave as expected or desired when the analog circuit portion and digital signal portion are merged. Further iterations are required to understand and correct for the adverse effects of merging the disparate analog and digital circuit portions. These design iterations increase the costs and delay the completion of the final integrated circuit product. Further delays occur if the digital portion does not work properly, or takes longer to design than expected. These delays add to the time-to-market of the product, a significant detriment in the competitive business environment.

In the design methodology of the present invention, a circuit that emulates the digital noise interference of the digital circuit portion is used. This emulation circuit is included in the test substrates that hold the different iterated versions of the analog circuit portion in development. Since the emulation circuit can be designed ahead of time, there are no delays in the analog evaluation caused by the digital design and debugging. Also, the emulation circuit is flexible to model different digital noise patterns. Besides providing a constant test for noise immunity of the developing analog circuit portion, the information gained from the digital noise emulation circuit allows changes to be made in the digital circuit portion to minimize interference effects.

In discussing the figures in the paragraphs below, all item numbers are consistent through the figures. In each item number, the digit or digits before the last two digits corresponds to the figure in which that numbered item first appears. For example, item number 310 first appears in FIG. 3, item number 1010 first appears in FIG. 10.

Figure 1:
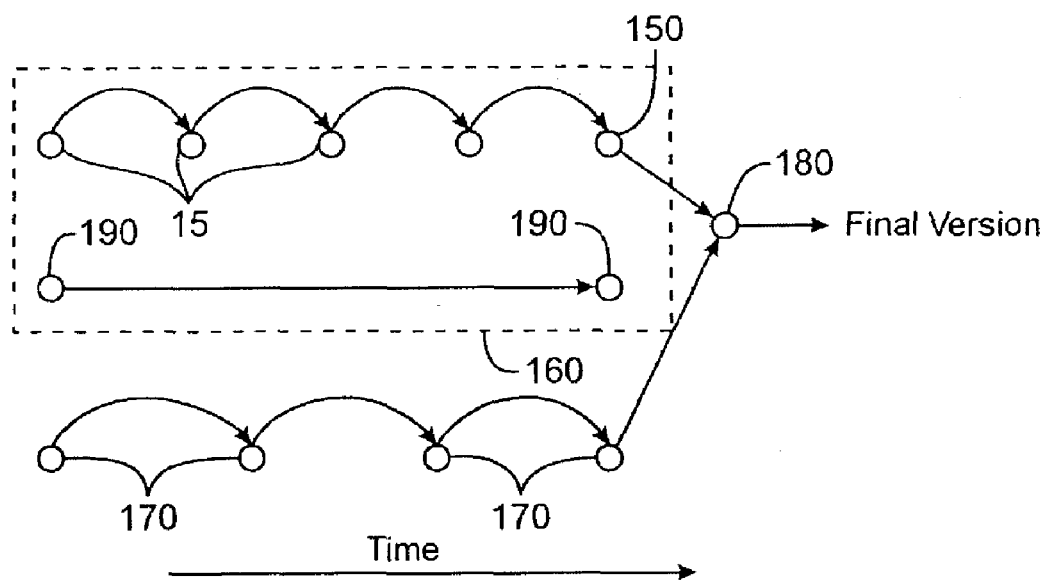
FIG. 1 is a symbolic representation of the design methodology, according to one embodiment of the present invention.

FIG. 1 symbolically indicates the methodology of the present invention. Circles 150 indicate the iterated versions of the analog circuit portion of the desired integrated circuit. Looping arrows between the circles 150 show that the analog circuit portion is iteratively redesigned in time. The enclosing dotted line 160 indicates the test substrate that holds the various iterations of the analog circuit portion. Two circles 190 and the flat arrow between them indicate an unchanged digital emulation circuit. The circles 170, also connected by looping arrow symbols, indicate the different versions of the digital circuit portion of the targeted integrated circuit. The design versions of the digital circuit portion remain separated from the analog circuit portions until final versions of the analog circuit and digital portions are obtained. At this point, the designs are combined into a single integrated circuit, the final version 180.

Figure 2:
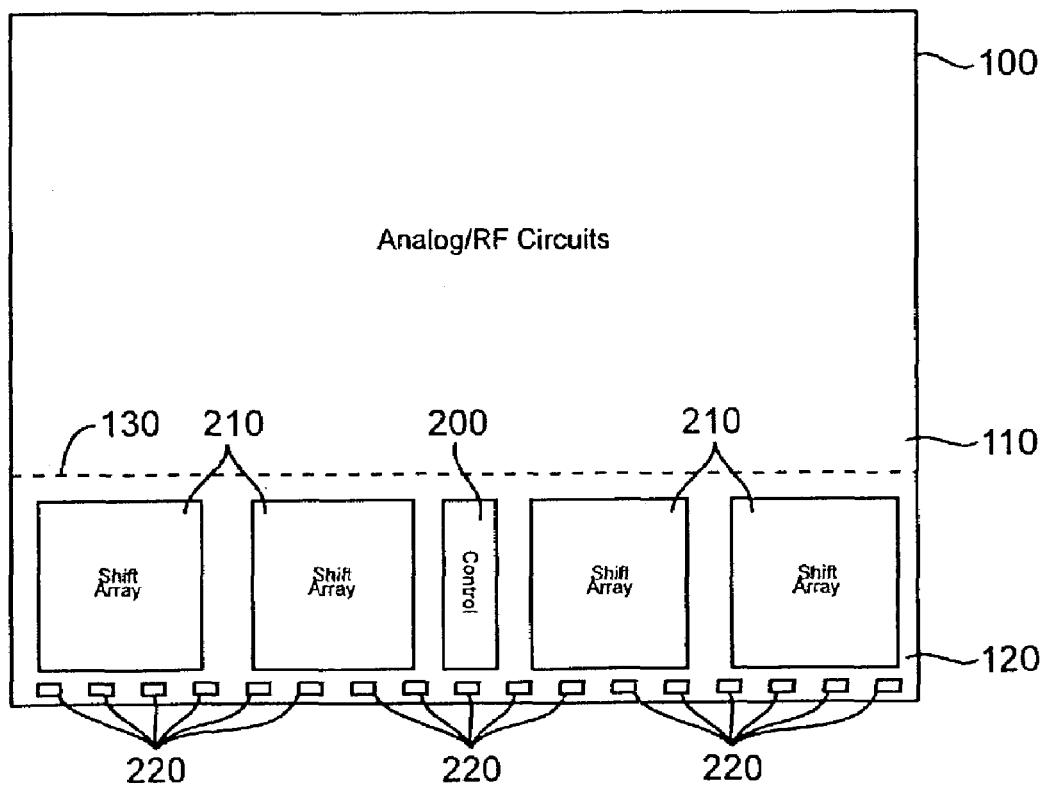
FIG. 2 illustrates a test die for an integrated circuit having a version of an analog circuit portion and a digital emulation circuit, according to one embodiment of the present invention.

FIG. 2 illustrates an integrated circuit test substrate 100 according to the present invention. The test substrate 100 is divided into an analog circuit region 110 and a digital circuit region 120. A dotted line 130 illustrates the symbolic division between the two portions 110 and 120. In the test substrate 100, the analog circuit region 110 holds the various versions of the analog circuit portions. On the other hand, the digital circuit region 120 holds a digital emulation circuit that has a control block 200, a plurality of shift arrays 210, and pads 220. The control block 200 receives input signals on pads 220 of the digital emulation circuit. The control block 200 on consecutive clock cycles decodes the inputs into addresses that select control registers in the control block, and then into data that is stored in the selected control register. The control registers in turn provide inputs for the shift arrays 210. Lastly, the shift arrays 210 output data to pads 220.

In one embodiment of the present invention there are 30 pads total, including 16 output pads, comprising 4 groups of 4 pads. Each group of four couple to one of the four arrays. Additionally there is one output pad for the bypass shift mode, and one that serves as a Dataoutvld line. Inputs include a Clk, Reset, two Command pads, 4 data inputs referred to as Datain[0:3], and a Commandvalid pad. Supplies include a 3.3 Volt supply for the I/O circuits, a 1.8 Volt supply for the core logic gates, and a Vss for ground reference.

Figure 3:
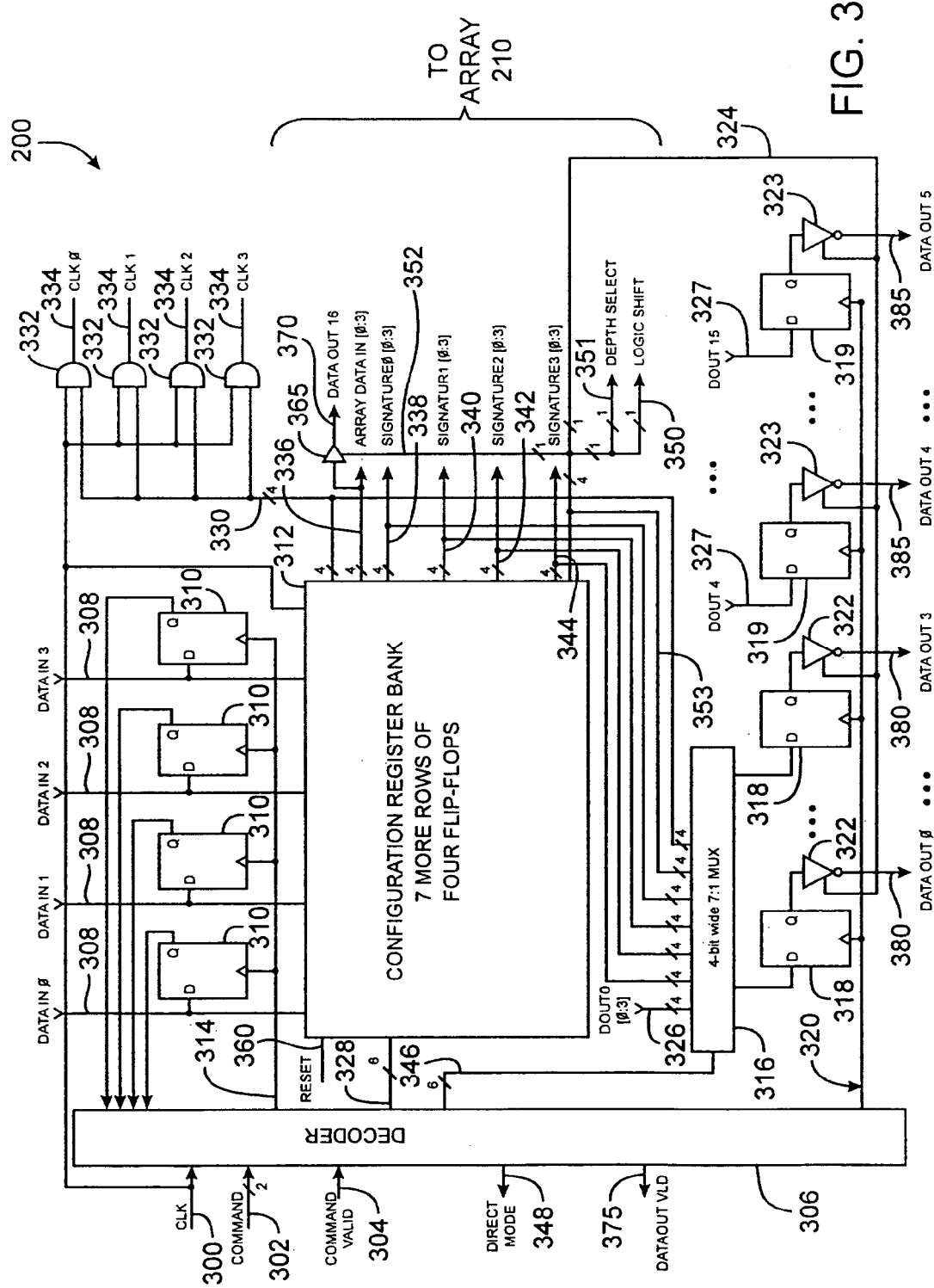
FIG. 3 illustrates the various components of the control block which decodes input commands and controls the arrays to either shift or load values.

FIG. 3 illustrates one embodiment of the control block 200 in detail. Besides a decoder block 306, the control block 200 has flip-flops 310 and configuration register bank 312, which configures the emulator. Configuration registers in configuration register block 312 can be read from and written into, based upon commands output from the decoder. These configuration registers store the clock enable, data input, and signature value signals that are sent to each of the arrays 210. Other configuration registers enable or disable the data outputs. The configuration registers contain information, such as clock enables for each array 210, and control the modes in which each array operates, i.e., direct mode, simple shift, or logic depth shift. One embodiment of the present invention has seven configuration registers, including four signature registers, a register for the clock enable, a register for Arraydatain, as well as a chip control information register.

In one embodiment of the present invention, the control block has a Clk signal line 300, two Command lines 302, and a Commandvalid signal line 304 as inputs from pads 220 to the decoder 306. The control block also has input lines Datain[0:3] 308 from pads 220, each of which connect to one flip-flop 310 and to one flip-flop in each of seven additional configuration registers inside register bank 312. The register bank 312 is made up of seven configuration registers, each is made up of four flip-flops, each connecting to one input line Datain[0:3] 308. The Q outputs of flip-flops 310 drive the decoder 306. The decoder 306 provides a clock signal on the clock signal line 314 for flip-flops 310. Outputs of the register bank 312 are seven 4-bit words on seven 4-bit lines, six of which connect to 4-bit wide 7:1 multiplexer 316, 5 of which also connect to arrays 210, and one clock enable register which connects to AND gates 332. The six 4-bit words from register bank 312 that couple to the 4-bit wide 7:1 multiplexer comprise Signature0[0:3] 338, Signature1[0:3] 340, Signature2[0:3] 342, Signature3[0:3] 344, clock enable lines 330, and chip control information register outputs 353. The five 4-bit words from register bank 312 that couple to the arrays 210 comprise Arraydatain[0:3] 336, Signature0[0:3] 338, Signature1[0:3] 340, Signature2[0:3] 342, and Signature3[0:3] 344. Also, the chip control information register has two outputs, Depthselect 352, and Logicshift 350 that connect to arrays 210, and two enable outputs, one of which (line 324) connects to 16 Dataout buffers, and one which (line 352) connects to the single pad output buffer for Dataout[16]. The output of the 4-bit wide 7:1 multiplexer 316 connects to output flip-flops 318, which are clocked by the signal on clock line 320 from the decoder 306. Outputs from the flip-flops 318 connect to output buffers 322, which in turn couple to pads 220. Output buffers 322 are enabled by the signal on an output enable line 324. Four data lines from each of the other three arrays, for 12 total lines 327, couple to the D inputs of flip-flops 319, which are clocked by the signal on clock line 320 from the decoder 306. Q outputs from the flip-flops 319 couple to output buffers 323, which in turn couple to pads 220. Output buffers 323 are enabled by the signal on output enable line 324.

The clock enable configuration register has a 4-bit wide output bus 330, each bit of which connects to an input of a two input AND gate 332. The other input to the AND gate is Clk input 300. Each output of an AND gate 332 is the clock line 334 for an array 210. In this manner, the clock signal to each array can be enabled or disabled by stored data in register bank 312. The clock enable output lines 330 of register bank 312 also connects to the 4 bit wide 7:1 multiplexer 316. The Arraydatain[0:3] 336, Signature0[0:3] 338, Signature1[0:3] 340, Signature2[0:3] 342, and Signature3[0:3] 344 outputs of register bank 312 connect to arrays 210 and to the 4-bit wide 7:1 multiplexer 316. It will be recognized by one skilled in the art that this architecture is just one of many that may be used to implement the invention as described in the claims. This description and accompanying diagrams are for illustrative purposes only, and does not limit the metes and bounds of the claims themselves.

Since there are two Command lines 302 from pads 220 to the decoder 306, there are $2^2$, or four, commands possible. These commands are: write to a register, read from a register, direct, and shift. These will be discussed in turn below.

The configuration registers in register bank 312 may be written to in the following manner. On the first rising edge of the signal on Clk line 300 that occurs when the signal on Commandvalid 304 is high and the signals on Command lines 302 are in the write setting, the signal on clock line 314 will go high, latching the data on the Datain[0:3] lines 308 into flip-flops 310. The outputs of flip-flops 310 connect to the decoder 306, where they act as a pointer and select one of the seven configuration registers in register bank 312. On the next rising edge of the clock signal at Clk 300, the decoder 306 selects the configuration register in register bank 312 that is being pointed to by asserting the appropriate bit on control bus 328. The selected configuration register in register bank 312 then stores the data from data input lines 308.

The configuration registers in register bank 312 may be read from in the following manner. On the first rising edge of Clk 300 that occurs when the signal on Commandvalid 304 is high and the signals on the Command 302 lines are in the read setting, the signal on clock line 314 will go high, latching the data at Datain[0:3] 308 into flip-flops 310. The outputs of flip-flops 310 connect to the decoder 306, where they act as a pointer. Using 6 bit wide select bus 346, the decoder selects one of the six inputs from the register bank 312 that connect to the 4-bit wide 7:1 multiplexer 316. The multiplexer 316 then outputs data to flip-flops 318. On the following rising edge at Clk 300, the signal on clock line 320 will go high latching data from the output of the multiplexer 316. The flip-flops 318 then drive their corresponding output drivers 322, which in turn drive data at Dataout [0:3] to pads 220. Output drivers are enabled and disabled together by output enable line 324.

The digital emulator will go into the direct mode whenever that mode is selected by the Command lines 302 and the Commandvalid line 304 is high. In direct mode, every flip-flop in each array 210 loads the corresponding bit from the Arraydatain[0:3] output 336 from the register bank 312. Once the emulator is in direct mode, on every rising edge the configuration register will latch the signals on Datain lines 308, and output them to arrays 210 on Arraydatain[0:3] lines 336. At the same time flip-flops 318 and 319 will latch data from the arrays on lines Dout[0:15] 326 and 327. These signals will then be output through output buffers 322 and 323 onto Dataout[0:15] lines 380 and 385.

One embodiment of the present invention can operate in one of three shift modes. There is the simple shift mode, as well as two logic depth shift modes. In all shift modes, the flip-flops in arrays 210 shift data from one flip-flop to the next. In either of the logic depth shift modes, the data in each flip-flop of the array 210 is right shifted after being XORed with a bit in that array's signature register. Data is shifted through the whole register bank. Each array outputs four bits of data; the first bit is tapped off after being shifted through 128 flip-flops. Subsequent bits are taken from flip-flops 256, 384, and 512. The signature is a four-bit value that is used sequentially by each group of four flip-flops in the arrays. There is one four-bit signature value for each array, and each signature value is stored in a separate configuration register. The two logic depth shift modes differ from each other in that one has a 4 inverter chain between flip-flops in array 210, and one has a 10 inverter chain. In the simple shift mode, the data right shifts from one flip-flop to the next without being XORed with the signature data, and without passing through either inverter chain. In each of the shift modes, the data is latched from Datain line 308 and placed on Arraydatain[0:3] lines 336 on each rising edge of the signal on Clk line 300. Outputs from the 128, 256, 384 and $512^{th}$ flip-flop are taken out and routed on Dout[0:15] lines to multiplexer 316 and flip-flops 319. Select line 346 from the decoder selects Dout[0:3] lines 326 for coupling to flip-flops 318. On the next rising edge the signal on Clk line 300, the data on the Dout lines are latched into flip-flops 318 and 319, and output through buffers 322 to Dataout lines 380 and 385.

Additionally there is a single pad mode, in which just one pad switches while all the clock lines to the arrays are disabled. In this mode, all the clock enable bits 330 from a configuration register in configuration register block 312 are set low, forcing the signals on Clk[0:3] lines 334 to be low. With the emulator in the shift mode, the signal on Clk line 300 continues to toggle, clocking the signals from the Datain lines 308, into a configuration register in configuration register bank 312, and out of that configuration and onto Arraydatain[0:3] lines 336. One of these lines is coupled to an output driver 365, and an output signal is sent to the Dataout[16] pad. The output driver is enabled and disabled by a bit in the chip control information register. In this way, the effects of one pad's switching noise on the analog circuitry may be examined.

One embodiment of the present invention uses a Reset line 360. The Reset line 360 may be under control by a signal on a pad, the signal on it may be active for some amount of time after the power supply is turned on, or both. The signal on the Reset line 360 can be used to force all the configuration registers in the configuration block 312 into known states all at once, thereby eliminating the need to write to each configuration register individually. The configuration registers may be reset to default values as follows: all signature registers to all zeros, clock enable register to all ones, and chip control information register to all zeros.

One embodiment of the present invention uses a 4-bit wide 6:1 multiplexer followed by a 4-bit wide 2:1 multiplexer in place of the 4-bit wide 7:1 multiplexer 316. In that embodiment, six 4-bit wide bus lines Signature0[0:3] 338, Signature1 [0:3] 340, Signature2[0:3] 342, Signature3[0:3] 344, clock enable lines 330, and chip control information register outputs 353, which comprise signal lines Depthselect 351, Logicshift 350, and output enables 352 and 354, are each inputs to the 4-bit wide 6:1 multiplexer. The output of the 6:1 multiplexer is coupled to a 4-bit wide 2:1 multiplexer. The other input of the 2:1 multiplexer is Dout0[0:3], which is the output bus from the array 0. The four outputs of the 2:1 multiplexer are again coupled to flip-flops 318, as are the outputs of the 4-bit wide 7:1 multiplexer 316 in FIG. 3. The multiplexer selections for both the 6:1 and 2:1 multiplexer are again done under the control of the decoder block 306 and select bus 346.

A Dataoutvld line 375 may be used to verify the validity of the output signals on the Dataout lines. A counter in Decoder 306 keeps track of the number of clock cycles following a valid command signal, and outputs a signal on the Dataoutvld 375 line at the time when signals from the device begin appearing at the Dataout lines 380 in response to the command signal.

One embodiment of the present invention also makes use of the four-bit configuration register referred to above as the chip control information register. That register resides in the configuration register bank 312. The four bits are stored in flip flops with outputs coupled to signal lines Logicshift 350, Depthselect 351, the control 352 for the output driver for Dataout[16] 370, as well as the output enable line 324. Logicshift 350 is used to determine whether the emulator is in the simple shift mode, or one of the logic depth modes. Depthselect 315 determines whether the logic path in the interconnecting logic block, as described below, consists of 4 or 10 inverters. The signal on enable lines 352 and 324 control whether the output drivers they connect to are enabled or disabled.

Figure 4:
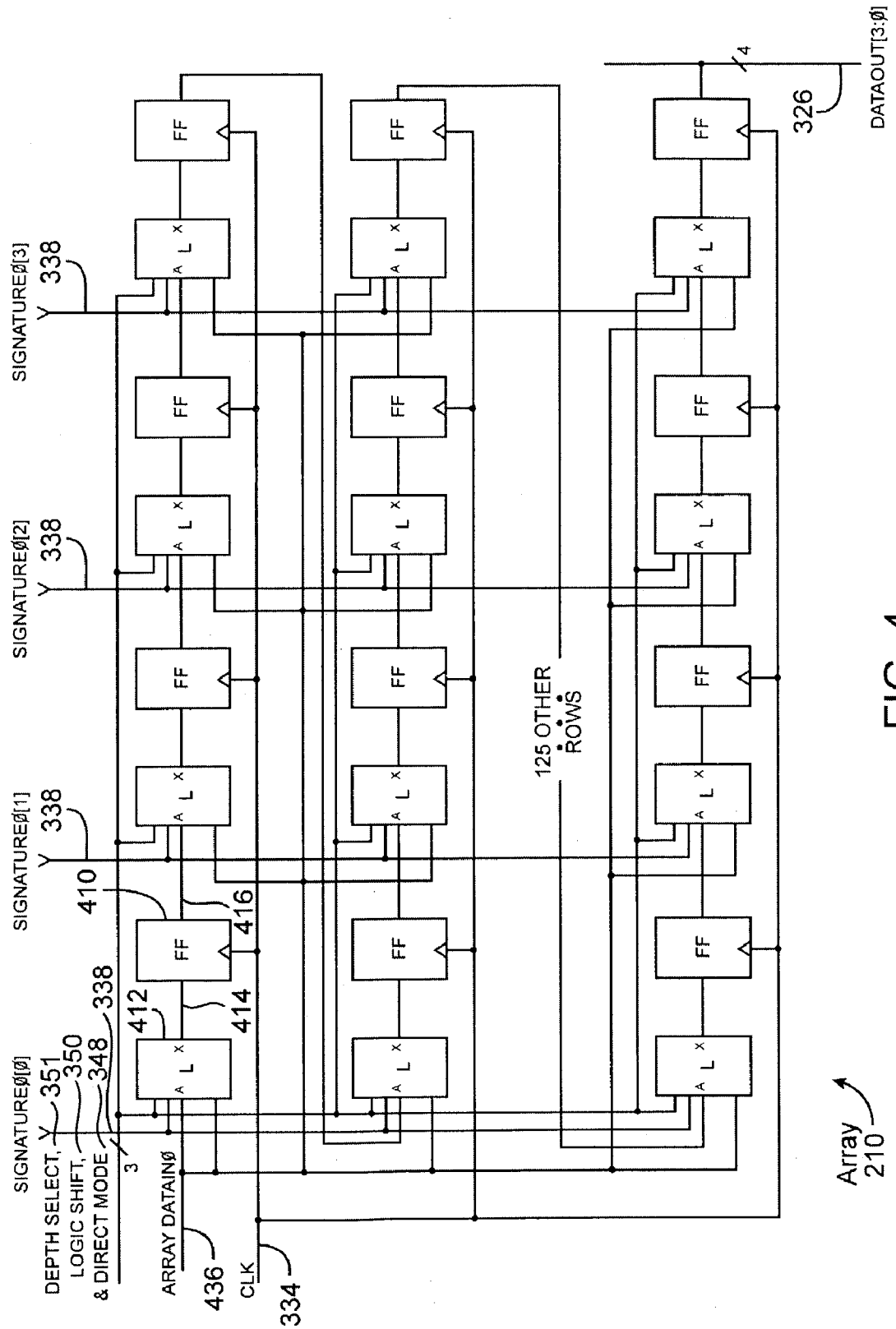
FIG. 4 illustrates a single array instance of the digital noise emulation circuit of FIG. 2, which array contains a series of flip-flops arranged as a shift register with interconnecting logic between the flip-flops that can be configured by the control block.

FIG. 4 illustrates one of the shift arrays 210 in detail. Each shift array 210 has a number of flip-flops 410 chained together with interconnecting logic 412 to form a shift register. The number of flip-flops 410 in the array 210 can be varied from one implementation of the digital noise emulation circuit to the next to accurately model the amount of logic in gates that is representative of the final circuit. Varying numbers of flip-flops may be put in the emulator; alternately the number may be programmed by configuration registers not included in this embodiment. In one implementation of the digital noise emulator, there are four array instances, with each array having 512 flip-flops 410 connected in 128 rows of 4. Four outputs Dataout[3:0] 326 are taken out of each array 210; these outputs are located at the $128^{th}$, $256^{th}$, $384^{th}$ and $512^{th}$ flip-flop 410 of the array 210. These four outputs from each array 210 are routed back to control block 200. Choosing these outputs of the shift register ensure certain variability in the noise patterns generated. The array 210 is set in either the simple shift mode, or a logic depth shift mode by the signal on the Logicshift line 350, or instructed to be in the direct mode by the signal on the directmode signal line 348. In the direct mode, the data on line Arraydatain 436, which is one of the Arraydatain [0:3] 336 lines in the control block, is loaded into each flip [0:3] flop 410 in array 210. If the array is in the logic depth shift mode, Depthselect 351 will determine whether a 4 inverter or 10 inverter mode is selected.

The array is clocked by the clock signal on the clock line Clk 334. The four signature lines 338 each connect to 128 of the interconnecting logic blocks 412. The first signature line 338 connects to the first interconnecting logic in each row. The second signature line connects to the second interconnecting logic, the third to the third, and the fourth to the fourth.

Figure 5:
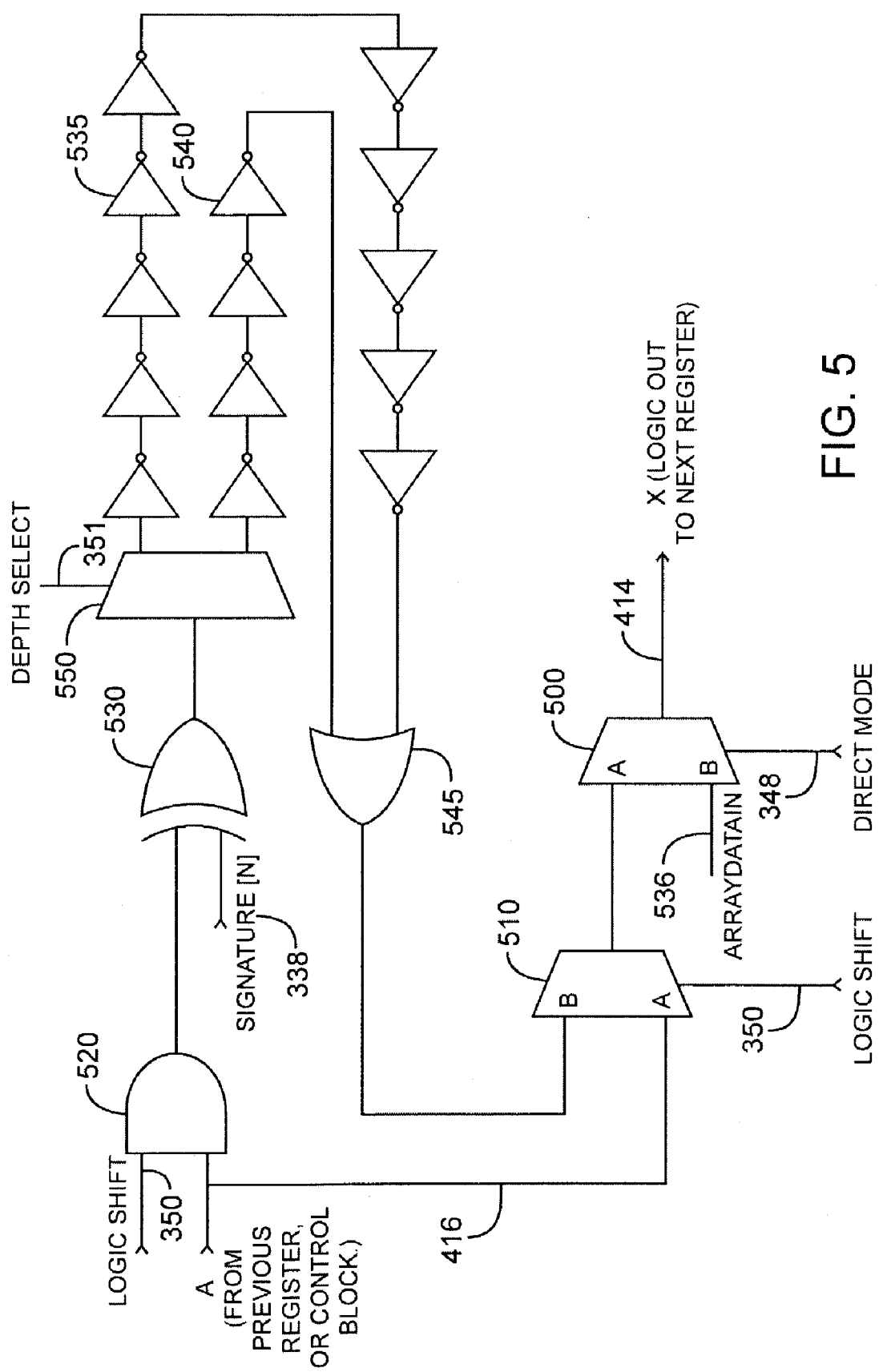
FIG. 5 illustrates the interconnecting logic between two flip-flops.

FIG. 5 illustrates the interconnecting logic block 412 in detail. This circuitry can operate in one of four modes. It can operate in the direct mode, simple shift, or one of two logic depth shift modes. In the direct mode, the bit on the Arraydatain line 536, which is one of the Arraydatain[0:3] lines 336 from the control block 200 is directly loaded from a configuration register in register block 312, through the B input of multiplexer 500 and simultaneously into all the flip-flops 410 in array 210. A different bit can be loaded into each array 210; but all the flip-flops 410 within the same array 210 load the same bit.

In any of the shift modes, all the flip-flops 410 in array 210 shift data from one flip-flop 410 through the interconnecting logic 412 and into the subsequent flip-flop 410. In the simple shift mode, flip-flop 410 drives a subsequent flip-flop 410 through the A input of multiplexer 510, and the A input of multiplexer 500. In both the logic depth shift modes, flip-flop 410 drives logic AND gate 520, which along with the signal on the signature value line 338 drives an XOR (eXclusive OR) gate 530, and multiplexer 550 which in turn connects to inverter chains 535 and 540. Control signal Depthselect 351 from a configuration register in configuration register block 312 selects which chain of inverters is selected. Chain 540 has 4 inverters, chain 535 has 10 inverters. Selecting between them will vary the amount and type of switching and coupling noise that is generated by the emulator. Each inverter chain 535 and 540 terminates in OR gate 545. The non-selected inverter chain's input has its input coupled to ground for proper logic operation. Next in logic depth shift mode, the output of the OR gate 545 is selected at input B of multiplexer 510, passed though to input A of multiplexer 500, and finally to node X 414 which connects to the input of the next flip-flop 410. In the logic depth shift mode, data is XORed at gate 530 with the signature value 338 for the purpose of being able to create pseudo random patterns that create pseudo random noise effects when Dataout[3:0] 326 is sent to pads 220.

Figure 6:
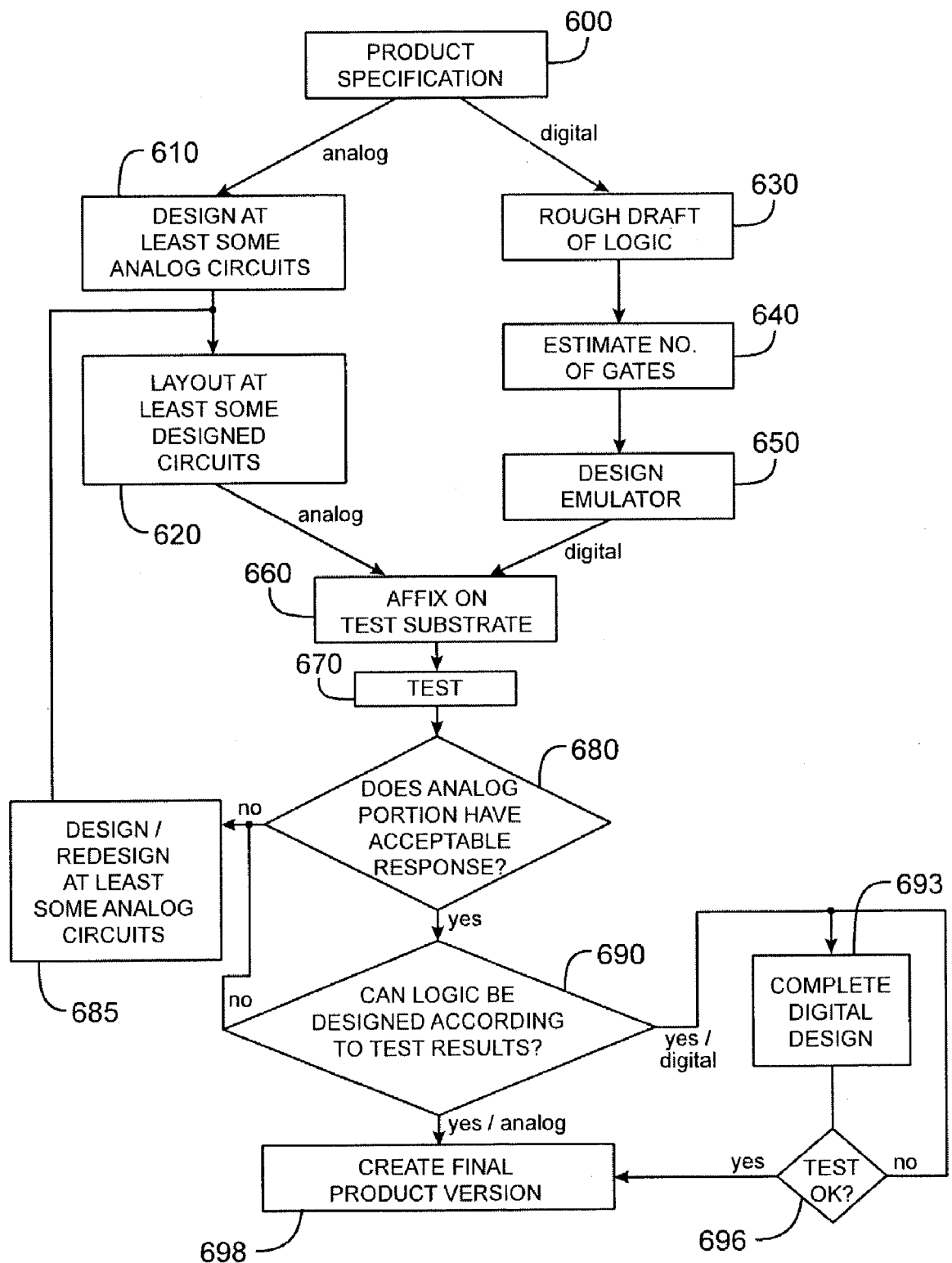
FIG. 6 is a flow chart showing the design methodology used by one embodiment of the present invention.

FIG. 6 is a flow chart showing one embodiment of the present invention. The flow chart begins with a product specification 600. This specification may be an industry standard, such as IEEE 802.11, Bluetooth, HomeRF, and the like. The specification may alternately or in combination be based on projected customer needs, or actual customer requests. The specification can, at least to some extent, be divided into analog and digital portions. There need not be any clear line of demarcation between the two, generally the analog portion will be a portion of the chip that is susceptible to noise and interference, and the digital portion will be a portion of the chip that generates noise, and tends to be less sensitive to it.

At least some of the circuitry in the analog portion is designed 610, and at least some of that portion is layed-out, and at least some of that is chosen for testing 620. In the preferred embodiment, the digital portion is designed 630 at least enough to get an estimate on the number of gates required 640. An estimate of the number of gates per flip-flop to be used in the emulator can be divided into this number to find the required number of flip-flops for the emulator. In this way, the size of an emulator which will generate an amount of noise that is substantially equivalent to that generated by the digital portion is determined, and the emulator designed 650.

The emulator and the layed-out portion of analog circuitry are then combined on a test substrate in step 660. The combining is done by laying out the circuits on a common test substrate. The layout may be done by hand drawing polygons on a CAD system, by an auto-routing program, and the like. Also, different circuits may be layed out in different ways. The analog circuits are then tested while the emulator is operated in different modes 670. For example, the clock rate, the amount of logic in the data path through the interconnecting logic, and the data pattern may all be varied. Furthermore, different arrays may be shut off, and either one or all of the output buffers may be enabled.

The results of this testing is then analyzed in step 680 to see if the analog portion has acceptable response to the emulator circuit, or whether it has at least a good enough response such that an engineering judgment may be made that with some known changes the response would be acceptable. If the analog circuitry has an unacceptable response under all conditions, then clearly the analog circuitry needs to be redesigned, step 685. If the analog circuitry has acceptable response to the emulator operating in at least one configuration, the next question 690 becomes whether the digital circuitry can be designed to match that configuration. If the answer is no, the analog portion is redesigned, 685. If the answer is yes, then the digital portion can be designed, step 693, and tested 696. The testing may be done by simulation, by the use of FPGAs, bread-boarding and the like. Once the digital portion is complete, it can be combined with the analog portion into the final product version, step 698. Additionally, the data gathered from the above testing may used to build a database about the process used in manufacturing the emulator circuit. This database may then be of aid in refining the analog modeling for the same process thereby increasing the chances of success on future test and product version integrated circuits, and reducing the number of revisions required before a version of the integrated circuit is production worthy.

Figure 7:
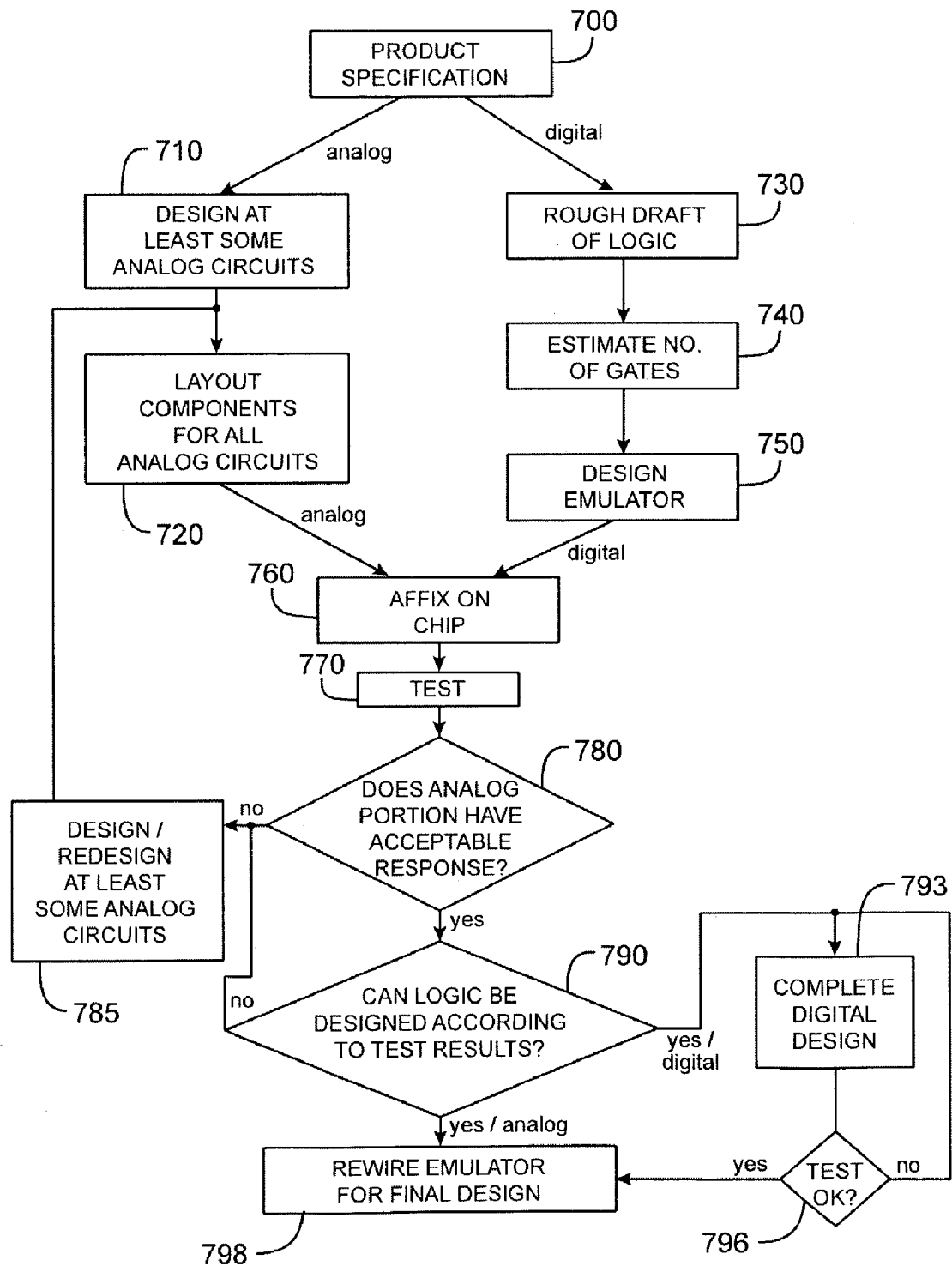
FIG. 7 is a flow chart showing the design methodology used by one embodiment of the present invention.

Another embodiment of the present invention is shown in FIG. 7. This embodiment takes advantage of the fact that gates and components on an integrated circuit can be rewired or reconnected to make different circuits without changing the gates and components themselves. In this embodiment, the digital portion is essentially a gate array, which is made up of a pattern of gates and route paths. This gate array can first be connected as a noise emulator for purposes of testing the analog portion, and later reconnected as the digital portion of the final chip. Further, as is true in any of these embodiments, the emulator itself can be rewired if errors are found in it.

In general terms, integrated circuits are made of diffused areas of impurities in a silicon substrate connected together by polysilicon and metal wires. Several integrated circuits are made together on wafer of silicon crystal. Much of the expense in the manufacture of a wafer of integrated circuits is in the masks used to define which areas on the wafer receive the diffused impurities. The polysilicon and metal layers tend to cost less since fewer masks are required. Also, the time required to complete the manufacture of a wafer can be greatly reduced if a head start can be achieved by using already available wafers with areas of diffused impurities, and then simply changing interconnect layers, which typically consist of the polysilicon and metal layers. Therefore, a design method in which an existing emulator is simply rewired by changing polysilicon and metal layers to change the emulator into a digital portion that is required for the final chip would save money and reduce manufacturing time.

Again, a product specification 700 is drafted, and the chip is roughly divided into analog and digital portions. At least some circuits in the analog portion are designed 710, and those circuits, along with enough devices for the remaining analog circuitry is layed out 720. Also, at least a rough draft of the digital portion is made 730, and the number of gates required is estimated 740. From dividing the number of gates used in each flip-flop into the number of gates estimated for the digital portion, the number of flip-flops in the emulator can be determined 750. This emulator and the analog circuitry are then combined on an integrated circuit 760. The emulator must have at least enough gates to be rewired to implement the digital portion. Further it is recommend that a fairly generous amount of routing path area is left between the gates to facilitate the rewiring of the emulator into the final product digital portion. This is true in particular, if automated tools such as an autorouter will be used to rewire the digital portion.

The integrated circuit is then tested along the same lines as described above. The results are then examined 780 to see if the analog circuits have an acceptable response to noise from the emulator in at least one of the emulator's configurations. If the answer is no, then the analog portion must be redesigned 785. If the answer is yes, the next question 790 becomes whether the digital portion can be designed in such a manner as to be similar to at least one of the configurations which resulted in acceptable response by the analog portion. If the answer is no, the analog circuitry goes back for redesign 785. If the answer is yes, the logic is designed 793, and tested 796. The emulator circuitry is then rewired into the digital portion design to make the final product 798.

This rewiring changes the emulator into the digital portion for the final product version of the integrated circuit. All the lower layer diffusion areas, buried layers, and the like are not changed, but remain the same in the emulator and final versions. In essence, the digital portion is a gate array. Only layers required for rewiring are changed, such as the metal and via layers. Contact and polysilicon layers may be changed or kept the same in various embodiments. By keeping the lower layers the same for the test and final product versions of the integrated circuit, fabrication time for the final product version is greatly reduced, since only the steps associated with the interconnect layer manufacturing need to be performed. Furthermore, confidence in the success of the final product version is increased since the individual components of the device have been verified in the testing phase.

Figure 8:
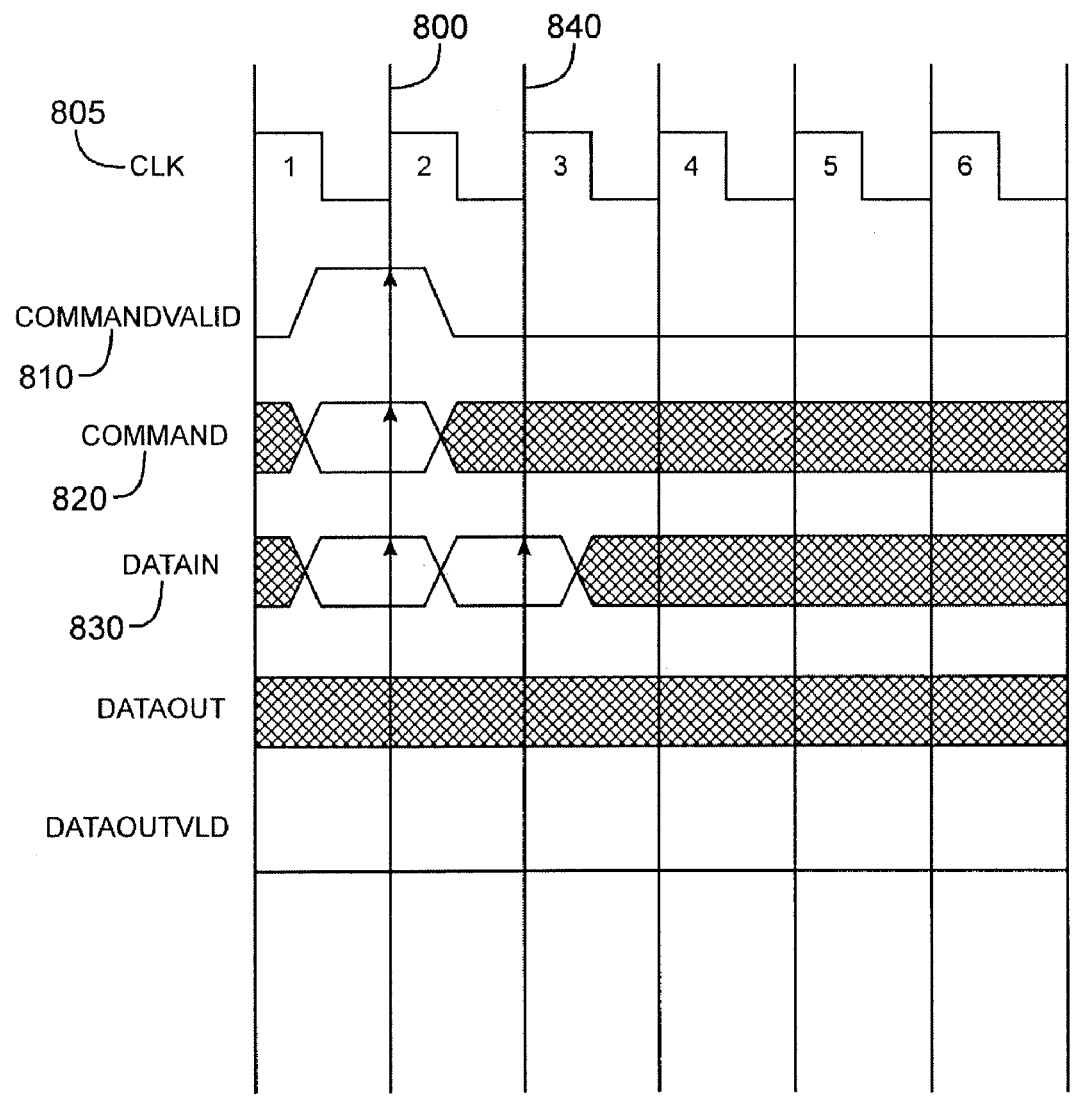
FIG. 8 is a timing diagram for writing to a configuration register.

FIG. 8 shows a timing diagram for writing to a configuration register used by one embodiment of the present invention. If the Commandvalid signal 810 on Commandvalid line 304 is high at the rising edge 800 of Clk signal 805, then Command signals 820 on Command lines 302 will be recognized as valid. If the command is to write to a register, the signal on clock line 314 will go high, and flip-flops 310 will latch the Datain signals 830 on data lines 308. The Datain signals will then appear at the outputs of flip-flops 310, which are coupled to the decoder 306. The decoder will then select a configuration register in the configuration register bank 312. On the next rising edge 840 of the Clk 805, one of the select lines 328 will be asserted, and the Datain signal 830 on Datain line 308 will be latched into the selected configuration register.

Figure 9:
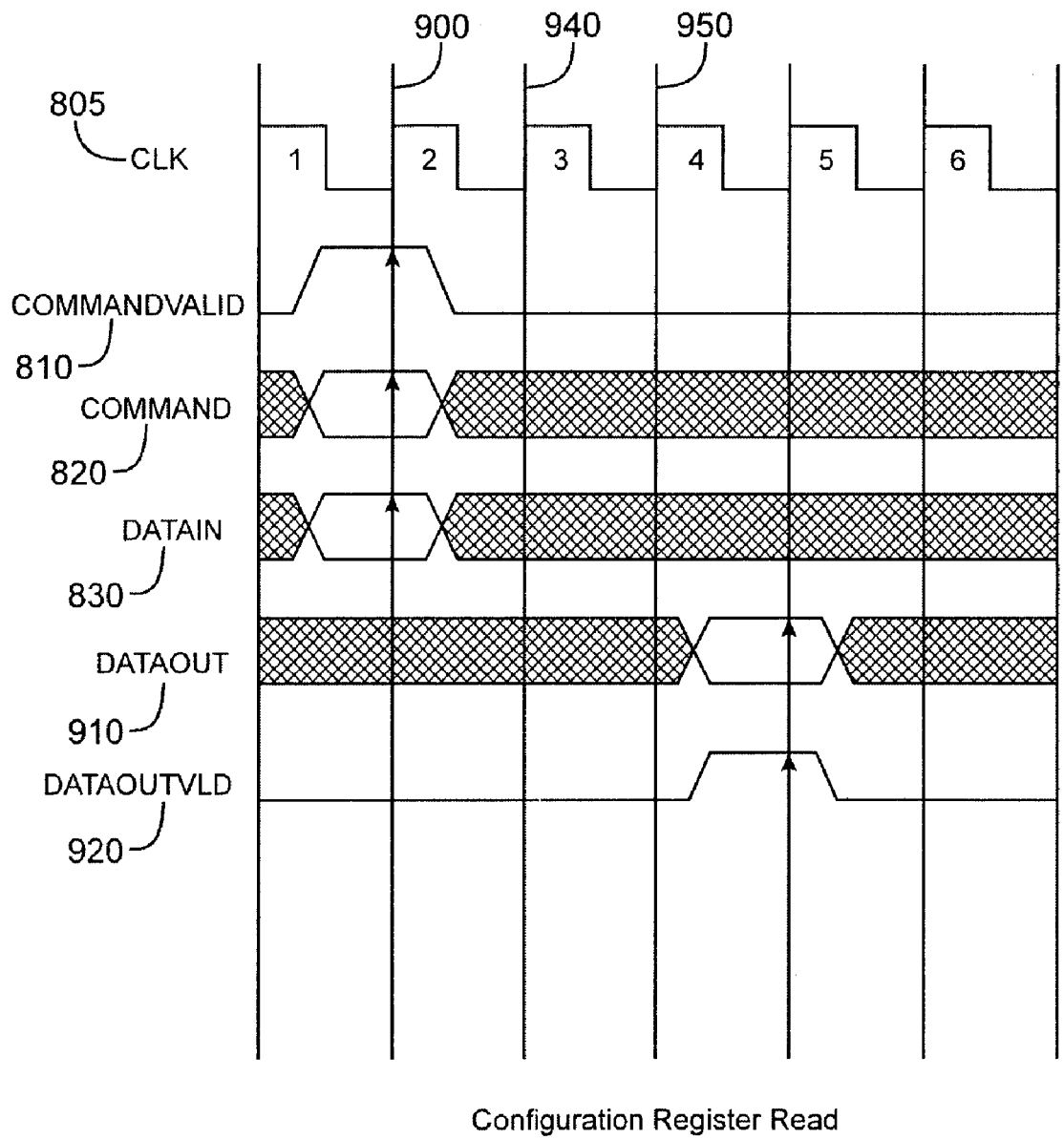
FIG. 9 is a timing diagram for reading from a configuration register.

FIG. 9 is a timing diagram for reading data out of a configuration register used by one embodiment of the present invention. If the Commandvalid signal 810 on Commandvalid line 304 is high at the rising edge 900 of Clk signal 805, the Command signals 820 will be recognized as valid. If the command is to read from a register, the signal on clock line 314 will go high, and flip-flops 310 will latch the Datain signals 830 on data lines 308. The Datain signals will then appear at the outputs of flip-flops 310, which are coupled to the decoder 306. The decoder will then use these signals to select an input to the 4 bit wide 7:1 multiplexer on the next rising edge of the Clk 940. On the next rising edge of Clk 950, the data is latched and output from flip-flops 318 by the signal on Clk line 300. A Dataoutvld logic block in the decoder 306 can be used to keep track of clock edges, and output a Dataoutvld signal 920 at the appropriate time. This signal is useful in particular for synchronizing an oscilloscope or other measuring or observation device.

Figure 10:
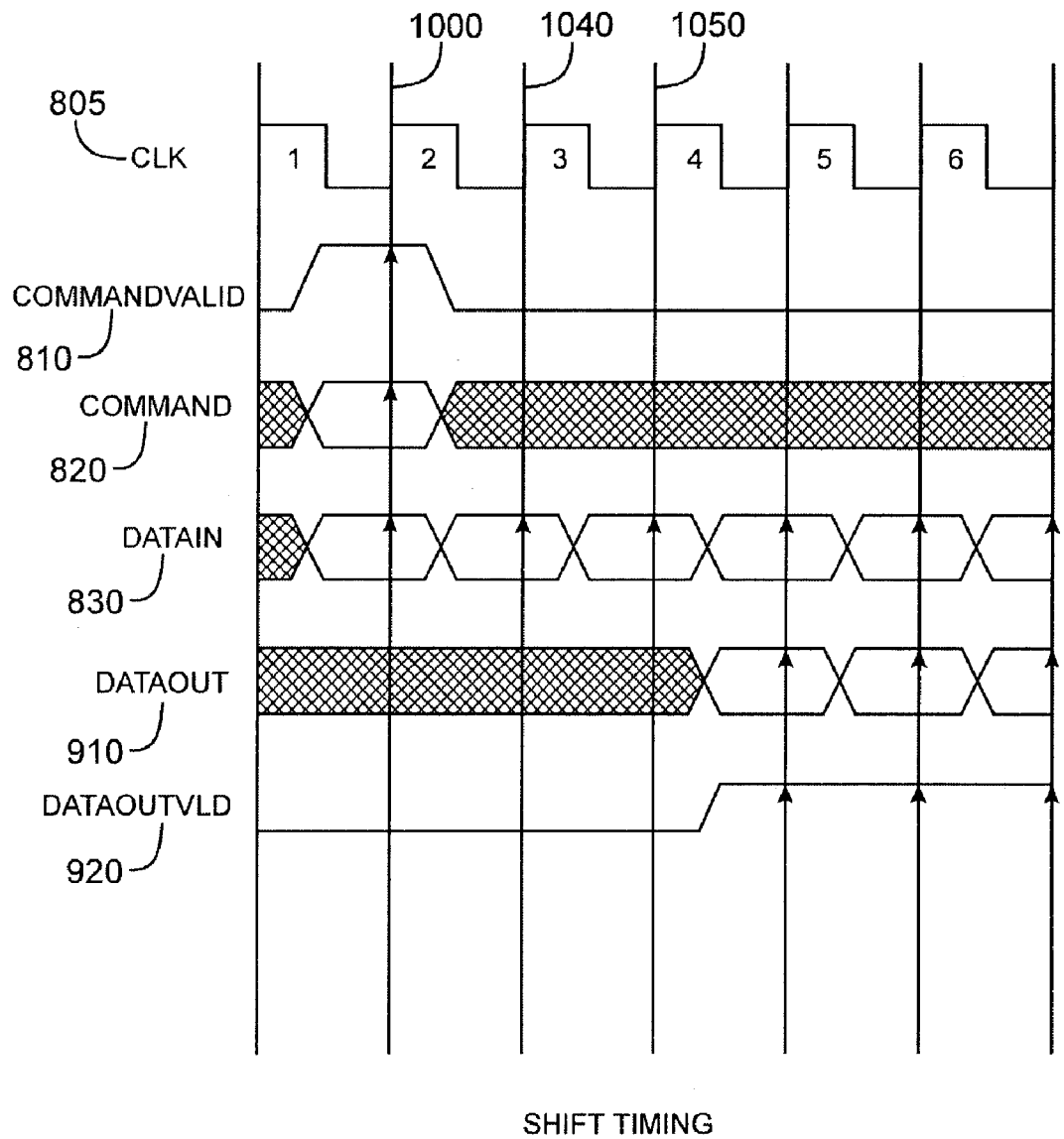
FIG. 10 is a timing diagram for the shift mode.

FIG. 10 is a timing diagram of the shift mode for the emulator circuit in one embodiment of the present invention. If the Commandvalid signal 810 on Commandvalid line 304 is high at the rising edge 1000 of Clk signal 805, the Command signals 820 will be recognized as valid. If the command is to shift, clock line 314 will go high, and flip-flops 310 will latch the Datain signals 830 on data lines 308. The Datain signals will then appear at the outputs of flip-flops 310, which are coupled to the decoder 306. The decoder will then select the Datain register in the configuration register bank 312. On the next rising edge 1040 of the Clk 805, one of the select lines 328 will be asserted, and the Datain signal 830 on Datain line 308 will be latched into the Datain register. On the third rising edge 1050 of Clk 805, the Datain stored in the Datain register is shifted into the first interconnecting logic block and flip-flop. At this time the Dataout signals 910 on lines is considered valid. A simple counter can be provided which counts these clock edges, and at this time a rising edge at Dataoutvld 920 may be provided. This signal is particularly useful as a trigger to an oscilloscope or other device for the purpose of synchronizing the observation of waveforms in the analog portion to events in the digital emulator. On subsequent rising edges of the Clk signal 805, the signals 830 on the Datain pins are clocked into the Datain register in configuration register bank 312, and data in the data register are clocked into the arrays 210. The emulator will stay in the shift mode until a new valid command is given. In this way, any data pattern, such as 10101, or pseudo random, may be made to appear at the pads 220 from Dataout lines 326.

One embodiment of the present invention uses an emulator which can operate in one of three different shift modes. These modes are pure or simple shift, logic depth shift of 4, and logic depth shift of 10. A chip control information register is one of the configuration registers in configuration register block 312. One bit controls whether the shift is simple, or logic depth. Another sets the depth to either 4 or 10 when the emulator is in logic depth shift mode.

Figure 11:
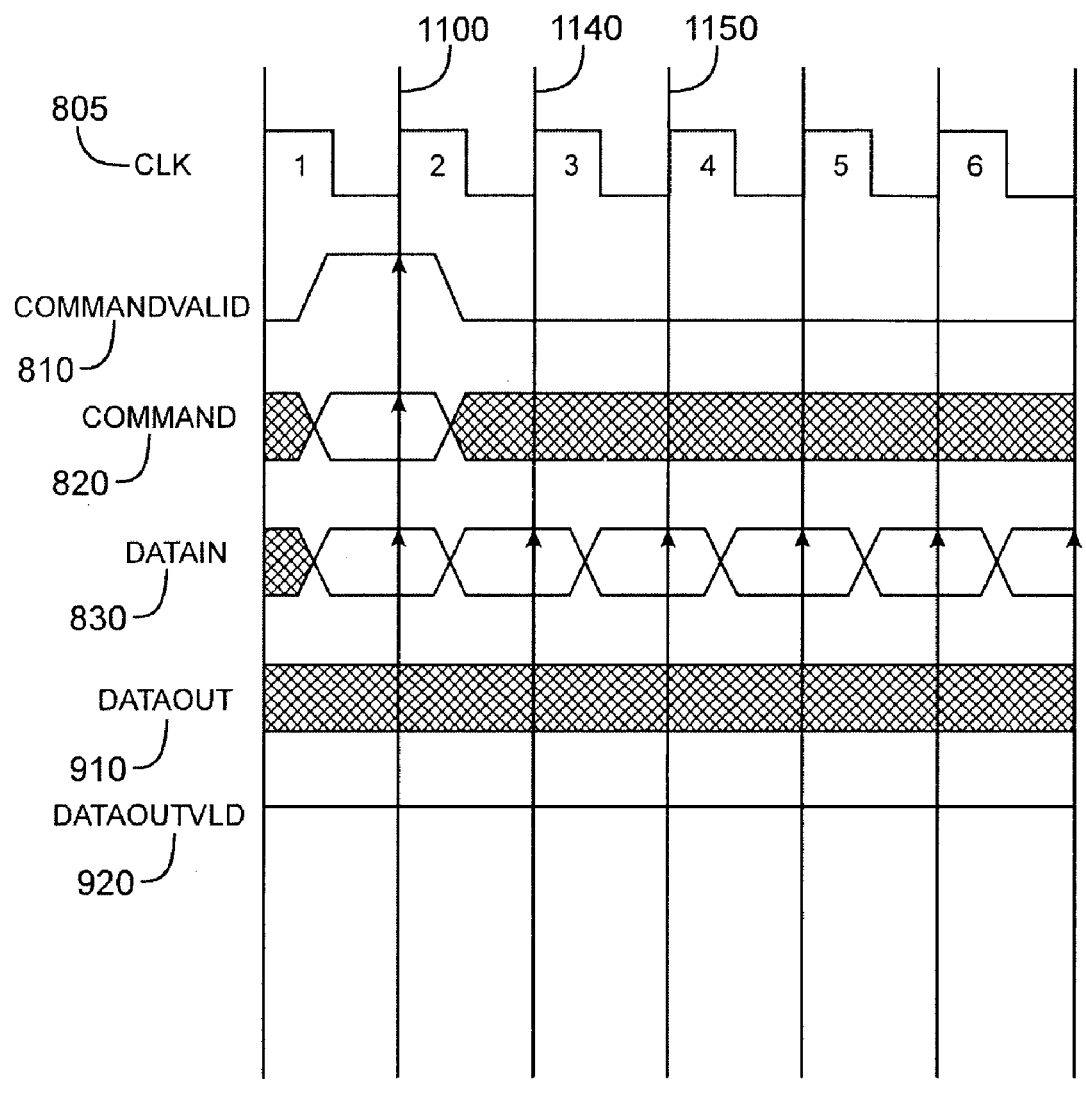
FIG. 11 is a timing diagram for the direct mode.

FIG. 11 shows a timing diagram for the direct mode used by one embodiment of the present invention. If the Commandvalid signal 810 on Commandvalid line 304 is high at the rising edge 1100 of Clk signal 805, the Command signals 820 will be recognized as valid. If the command is to go in the direct mode, clock line 314 will go high, and flip-flops 310 will latch the Datain signals 830 on data lines 308. The Datain signals will then appear at the outputs of flip-flops 310, which are coupled to the decoder 306. The decoder will then select the Datain register in the configuration register bank 312. On the next rising edge 1140 of the Clk 805, one of the select lines 328 will be asserted, and the Datain signal 830 on Datain line 308 will be latched into the Datain register. On the third rising edge 1150 of Clk 805, the Datain stored in the Datain register is shifted into every flip flop in the corresponding array. One embodiment of the present invention uses four arrays, and four Datain lines corresponding to a four bit wide Datain register. On the third rising edge 1150 of Clk 805, one bit from the Datain register is loaded into each array 210 by the Arraydatain[0:3] line 336. Either a 1 or a 0 may be loaded into each array, but every flip-flop in each array is loaded with the same bit.

Using the Digital Noise Emulator Circuit

The digital emulation circuit can be programmably altered in many ways and the resulting noise effects on sensitive analog and RF circuits can be measured. From these measurements, informed choices regarding the architecture of the digital portion can be made. As the analog circuitry is modified, as indicated by looping arrow symbols 150 in FIG. 1, the emulator should remain the same. In the meantime, the digital design may be progressing separately. When both are complete, they may be joined on a final version 180.

The output drivers may be programmably enabled or disabled. In one embodiment, data outputs Dataout[0:15] may be enabled or disabled together, and Dataout[16] may be independently enabled or disabled. In this way, the effect of just one output pad on the analog circuitry may be examined. Also, the loading on the output structure can be easily changed externally. It is obvious to one skilled in the art that the output drivers may be disabled individually with the use of more configuration registers and control lines. Output drivers and their associated pads and bond wires are generally the strongest source of digital interference in a mixed signal environment. Enabling and disabling the output pads while observing an analog portion parameter will aid in quantifying this effect.

The amount of logic that switches and therefore generates noise may be altered in at least two ways. Firstly, the logic 412 between the flip-flops 410 may be put in either the direct, simple shift, or logic depth shift mode. In the direct mode, only multiplexer 500 has data passing through it, so only that multiplexer 500 can contribute switching noise. In the simple shift mode, both the multiplexer 510 and multiplexer 500 pass data. In the logic depth shift modes, AND gate 520, an XOR gate 530, one of two string of inverters, 535 or 540, as well as multiplexers 500 and 510, are in the signal path.

Secondly, the amount of logic can also be changed by enabling and disabling arrays 210. In the preferred embodiment, the digital emulator circuit contains roughly the same amount of logic as the final digital circuit. This correlation can be achieved by estimating the number of logic gates in flip-flop 410 and then placing the required number of flip-flops 410 and arrays 210 to imitate the amount of logic that will be present in the final circuit.

Besides selecting the number of operating flip-flops in a shift array 210, each of the arrays 210 can be individually programmed to be off. This is done by writing a zero to the clock enable bit 330 in the corresponding configuration register in register block 310. This selectively shuts off the signals on the Clk[0:3] lines 334 to the arrays 210. If the signal on the clock enable line 330 is low, the AND gate 332 always has a low output. Therefore, with no signals on the Clk line 334, the corresponding array 210 is not clocked. If the signal on the clock enable bit 330 is high, then the signal on clock line 334 follows the Clk input 300. At the same clock rate, varying the number of arrays 210 provides valuable information about switching noise effects on the RF and analog circuits.

By varying the amount of operating flip-flops 410, and selectively enabling or disabling arrays 210, the emulation circuit can also be used to localize proximity-based coupling effects. For example, changes to parameter of a particular circuit in the analog potion may be observed while a nearby array 210 is enabled and disabled.

The emulation circuit is completely synchronous and can run through a wide range of clock frequencies. Hence, the emulation circuit provides a means of testing the digital circuits at various clock frequencies so that the digital clocking effects can be determined on the sensitive analog, especially the RF, circuits. For example sensitivity or some other parameters can be examined in the high end RF range for example 2.4 GHz, the mid IF range, for example 0–1 MHz, as well as the dc baseband frequency range. This, in turn, allows proper clock and clock-distribution planning on the final version of the integrated circuit that can reduce the clock as a source of noise to the mixed signal circuits. A pulse generator, such as an HP 8116A, made by Hewlett Packard Corporation of Palo Alto, Calif., can be used to drive the clock input pin. The clock rate is varied by simply changing the frequency of operation of the pulse generator. The clock may be varied through a range of 1 to 30 MHz, and the like.

Also, the data pattern may be varied by putting the emulator in the logic depth shift mode, and changing the values in the signature register. For example, a Arraydatain bit of zero may be loaded into each register, and all signature bits set to zero. As the array is clocked, an alternating pattern of ones and zeros is seen at the output of every register.

The emulation circuit can be used to characterize the amount of switching noise that might be present in the digital portion so that appropriate digital micro-architectural decisions can be made to reduce noise. First the amount of logic in the final product is estimated, and the corresponding amount of circuitry is found as described above. This amount of circuitry in the digital noise emulator circuit is enabled. Then the arrays 21 can be set in direct mode and the noise effects on the analog circuit portion measured. The arrays 21 can then be put in simpleshift mode and the noise effects measured again. Finally, the arrays can be set in logic depth mode and measured once more. The clock frequency of operation can then be varied and the experiment repeated. Also, the output buffers may be enabled and disabled while measurements are taken. Based on the results, a conscious micro-architectural decision can be made to reduce the amount of logic 412 or increase it between the flip-flops 410 in the digital design. Alternatively, or in combination, the clock frequency of the digital circuit portion can be picked to operate in a certain frequency range as to minimize the impact on the analog portion.

Tests may be performed where the clock rate and data pattern are varied. For example, the clock may be varied independently from 1, 2, 4, 8, 16, and 32 MHz. The data pattern may be set to be a pattern of all ones, all zeros, alternating ones and zeros, or pseudo random. The clock and data pattern may be varied together.

Also, the effect of I/O pads may be examined in great detail. For example, in the bypass mode, a single pad may be driven. The data pattern may be changed to all ones, all zeros, alternating ones and zeros, or pseudo random. Also, the clock, and therefore the data rate at the pad may be altered. Further, all the pads may be enabled, and the data patterns and rates similar modified. The number of pads enabled may be reduced by disabling the clocks to individual arrays. The loading on the output pads may be altered; for example capacitive, inductive, and resistive loading may be added or removed.

The manufacturing process and device modeling may be evaluated to some degree by measuring currents as a function of frequency, and enabled circuitry, and then comparing the test results to expected data. This includes leakage tests done at dc. These tests are most useful when performed over a varying clock frequency and temperature. Care must be taken that external loading on the outputs does not interfere with accurate measurements of the logic cells themselves. For example, the supply current can be measured with just the clock running. Also, the current can be measured with an alternating one zero data pattern, some other data patterns, or a pseudo random data sequence. Also, the clock rate may be changed, for example measurements may be made at 1, 2, 4, 8, 16, and 32 MHz, and the like. The results of some or all the testing herein may be used to develop a database on the process used to manufacture the digital noise emulator. This database will then be of help in refining the analog models for the process, thereby increasing the chances of success on future test and product integrated circuits, and reducing the number of revisions required to reach production versions of products.

This emulator circuit is also useful in analyzing RF and IF (Intermediate Frequency) circuits. Both RF and IF circuit blocks such as, but not limited to, mixers, filters, VCOs (Voltage Controlled Oscillators), limiting amplifiers (limiters), LNAs (Low Noise Amplifiers), discriminators, and phase splitters, are often either narrowbanded, or have specific bandpass, lowpass or highpass filter characteristics. The purpose of these characteristics is so the circuit block can reject or attenuate undesired frequency components while passing or enhancing desired frequency components. The frequencies that are passed or enhanced are in what is know as the circuit block's passband.

The emulator circuit generates some noise frequency components, which are in the passband, and some that are outside the passband of each circuit. Each noise frequency component has an associated amplitude. The noise frequency components that are inside the passband are of particular importance, since they will not be attenuated by the circuit's filter characteristic. Each emulator configuration has different noise frequency components, with different associated amplitudes. In general, more noise components with higher amplitudes in the passband lead to a reduction in functionality in the RF and IF circuit blocks. Different emulator configurations can be tried, and the reduction in functionality measured. As an example, sensitivity of the receive channel can be measured. Then, the above-described experiments can be run while measurements are made. From this, the optimum digital architecture can be designed by selecting the configuration that results in the best sensitivity.

These effects on the analog circuits may be examined over various ranges of frequency. For example, the effects may be observed over a broadband range of frequency, say dc to 5 GHz. In this way unexpected frequencies where interference is high may be observed. Also, a frequency range specific to the input frequency range for a particular standard, for example 2.4 to 2.4835 GHz for the ISM (Instrument, Scientific, and Medical) band may be examined. Furthermore, the spectrum around the intermediate frequencies for the device may be observed. For example 0 to 1 MHz, typically around 500 to 600 kHz, or 24 or 110 MHz, are common intermediate frequencies.

Hence, this digital noise emulation circuit is a unique and effective tool to enable co-integration of digital and sensitive mixed signal circuits in a quick and efficient manner. Its flexibility allows for a wide range of noise measurements that can be effectively used for making the correct architectural, micro-architectural and methodology decisions that allow for a quality digital and mixed signal integrated chip.

Therefore, while the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. A method of designing an integrated circuit having digital and analog circuit portions, said digital and analog circuit portions each having defined functions, comprising:
   providing a digital emulation circuit, which is capable of generating noise, and which has a configuration capable of being modified;
   affixing said digital emulation circuit on a test substrate;
   providing a version of said analog circuit portion having at least some of said defined functions of said analog circuit portion;
   affixing said analog circuit version on said test substrate;
   testing said analog circuit version while modifying the configuration of the emulation circuit; and
   providing the complete digital circuit portion, the design of which is based on the testing of the analog circuit version while modifying the configuration of the digital emulation circuit.

2. The method of claim 1 further comprising modifying said analog portion in response to said testing step.

3. The method of claim 2 further compromising:
   repeating said affixing digital emulation circuit step, said analog circuit portion providing step, said analog circuit portion version affixing step and said analog circuit portion version testing step so that a version of said analog circuit portion having all of said defined functions of said analog circuit portion, with acceptable response to said noise effects under operating conditions is obtained.

4. The method of claim 1 further comprising:
   providing a version of said digital circuit portion having all of said defined functions of said digital circuit portion; and
   affixing said digital circuit portion version to an integrated circuit including said version of said analog circuit portion having all of said defined functions of said analog circuit portion, with acceptable response to said noise effects under operating conditions.

5. The method of claim 4 wherein said digital circuit portion providing step includes testing said defined functions of said digital circuit portion separately from said analog circuit portion.

6. The method of claim 5 wherein said digital circuit portion testing includes programming an FPGA for testing said defined functions of said digital circuit portion.

7. The method of claim 5 wherein said digital circuit portion testing includes simulating said defined functions of said digital circuit portion.

8. The method of claim 1 wherein said emulation circuit comprises at least one array comprising at least one shift register.

9. The method of claim 8, wherein said testing said analog circuit version is performed while alternately shutting off and turning on at least one array.

10. The method of claim 8, wherein said shift register comprises:
    a plurality of flip-flops, each having a clock input for receiving a clock input signal, and each storing a data bit; and
    a plurality of interconnecting logic blocks, wherein said plurality of flip-flops couple to each other through said plurality of interconnecting logic blocks sequentially, and wherein said data bits form a data pattern.

11. The method of claim 10, wherein said testing said analog circuit version is performed while applying a signal at said clock input.

12. The method of claim 11, wherein said testing said analog circuit version is performed while varying said clock input signal.

13. The method of claim 10 wherein said testing said analog circuit version is performed while varying said data pattern.

14. The method of claim 10, wherein said interconnecting logic blocks comprise Exclusive-Or gates, and wherein said testing said analog circuit version is performed while varying said data pattern using said Exclusive-Or gates.

15. The method of claim 10, wherein said interconnecting blocks comprise a plurality of logic paths, wherein each logic path is comprised of differing amounts of logic gates, and wherein said testing of said analog circuit portion is performed while alternately selecting from among said plurality of logic paths.

16. The method of claim 10, wherein at least one of said flip-flops is coupled to an equal number of pads through an equal number of output drivers, which may be enabled and disabled.

17. The method of claim 16, wherein said testing of said analog circuit portion is performed while enabling and disabling said output drivers.

18. The method of claim 1 wherein said analog circuit portion includes an RF circuit subportion.

19. The method of claim 1, wherein a number of gates in said digital emulation circuit is substantially equivalent to a number of gates in said digital circuit portion.

20. A method of designing an integrated circuit having digital and analog circuit portions, said digital and analog circuit portions each having defined functions, comprising:
   providing a digital emulation circuit, which is capable of generating noise, and which comprises a plurality of logic circuits;
   affixing said digital emulation circuit on said integrated circuit;
   providing a version of said analog circuit portion having at least some of the defined functions of said analog circuit portion;
   affixing said analog circuit version on said integrated circuit;
   testing said analog circuit version while modifying the configuration of the digital emulation circuit; and
   providing the complete digital circuit portion, the design of which is based on the testing of the analog circuit version while modifying the configuration of the digital emulation circuit, wherein said digital circuit portion is formed by rewiring said digital emulation circuit.

21. The method of claim 20 further comprising modifying said analog portion in response to said testing.

22. The method of claim 21 further compromising:
   repeating said affixing digital emulation circuit step, said analog circuit portion providing step, said analog circuit portion version affixing step and said analog circuit portion version testing step so that a version of said analog circuit portion having all of said defined functions of said analog circuit portion, with acceptable response to said noise effects under operating conditions is obtained.

23. The method of claim 20 further comprising reconnecting said logic circuits to provide for said digital portion.

24. The method of claim 20, wherein said noise generated by said digital emulation circuit is substantially equivalent to noise generated by said digital circuit portion.

25. An integrated circuit having digital and analog portions, designed by a process comprising:
   providing a digital emulation circuit, which generates noise, and which comprises a circuit path that may be modified;
   affixing said emulator circuit on a test substrate;
   providing a version of said analog circuit portion having at least some of said defined functions of said analog circuit portion;
   affixing said analog circuit version on said test substrate;
   testing said analog circuit version, while modifying the circuit path in the digital emulation circuit; and
   providing the complete digital portion, the complete digital portion having a configuration based on the testing of the analog circuit while modifying the circuit path in the digital emulation circuit.

26. The integrated circuit of claim 25, designed by a process further comprising modifying said analog portion in response to said testing step.

27. The integrated circuit of claim 26, designed by a process further compromising:
   repeating said affixing digital emulation circuit step, said analog circuit portion providing step, said analog circuit portion version affixing step and said analog circuit portion version testing step so that a version of said analog circuit portion having all of said defined functions of said analog circuit portion, with acceptable response to said noise effects under operating conditions is obtained.

28. The integrated circuit of claim 25, designed by a process further comprising:
   providing a version of said digital circuit portion having all of said defined functions of said digital circuit portion; and
   affixing said digital circuit portion version to an integrated circuit including said version of said analog circuit portion having all of said defined functions of said analog circuit portion, with acceptable response to said noise effects under operating conditions.

29. The integrated circuit of claim 25 wherein said digital emulation circuit has at least one array comprising at least one shift register.

30. The integrated circuit of claim 29, wherein said shift register comprises:
   a plurality of flip-flops, each having a clock input for receiving a clock input signal, and each storing a data bit; and
   a plurality of interconnecting logic blocks, wherein said plurality of flip-flops couple to each other through said plurality of interconnecting logic blocks sequentially, and wherein said data bits form a data pattern.

31. The integrated circuit of claim 25 wherein said analog circuit portion includes an RF circuit subportion.

32. The integrated circuit of claim 25, wherein a number of gates in said digital emulation circuit is substantially equivalent to a number of gates in said digital circuit portion.

* * * * *